United States Patent
Chen et al.

(10) Patent No.: US 8,466,606 B2
(45) Date of Patent: Jun. 18, 2013

(54) INTEGRATION OF PIEZOELECTRIC MATERIALS WITH SUBSTRATES

(75) Inventors: David M. Chen, Brookline, MA (US);
Jan H. Kuypers, Cambridge, MA (US);
Alexei Gaidarzhy, Brighton, MA (US);
Guiti Zolfagharkhani, Brighton, MA (US); Jason Goodelle, Boston, MA (US)

(73) Assignee: Sand 9, Inc., Cambridge, MA (US)

( * ) Notice: Subject to any disclaimer, the term of this patent is extended or adjusted under 35 U.S.C. 154(b) by 261 days.

(21) Appl. No.: 12/899,447

(22) Filed: Oct. 6, 2010

(65) Prior Publication Data

US 2011/0187227 A1  Aug. 4, 2011
US 2012/0056510 A9  Mar. 8, 2012

Related U.S. Application Data

(63) Continuation-in-part of application No. 12/750,768, filed on Mar. 31, 2010.

(60) Provisional application No. 61/165,405, filed on Mar. 31, 2009, provisional application No. 61/368,227, filed on Jul. 27, 2010.

(51) Int. Cl.
*H01L 41/053* (2006.01)

(52) U.S. Cl.
USPC ............................ 310/348; 310/344; 310/349

(58) Field of Classification Search
USPC ................... 310/340, 344, 348, 349
See application file for complete search history.

(56) References Cited

U.S. PATENT DOCUMENTS

| | | |
|---|---|---|
| 1,785,036 A | 12/1930 | Marrison |
| 5,847,489 A | 12/1998 | Satoh et al. |
| 5,914,553 A | 6/1999 | Adams et al. |
| 6,124,765 A | 9/2000 | Chan et al. |
| 6,828,713 B2 | 12/2004 | Bradley et al. |
| 6,909,221 B2 | 6/2005 | Ayazi et al. |
| 6,943,484 B2 | 9/2005 | Clark et al. |
| 6,954,020 B2 | 10/2005 | Ma et al. |
| 6,995,622 B2 | 2/2006 | Partridge et al. |
| 7,005,946 B2 | 2/2006 | Duwel et al. |
| 7,104,129 B2 | 9/2006 | Nasiri et al. |
| 7,154,212 B1 | 12/2006 | Kosinski |

(Continued)

FOREIGN PATENT DOCUMENTS

| | | |
|---|---|---|
| WO | WO 98/01948 A1 | 1/1998 |
| WO | WO 02/17481 A2 | 2/2002 |

(Continued)

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

(Continued)

*Primary Examiner* — Thomas Dougherty
(74) *Attorney, Agent, or Firm* — Wolf, Greenfield & Sacks, P.C.

(57) ABSTRACT

Devices having piezoelectric material structures integrated with substrates are described. Fabrication techniques for forming such devices are also described. The fabrication may include bonding a piezoelectric material wafer to a substrate of a differing material. A structure, such as a resonator, may then be formed from the piezoelectric material wafer.

32 Claims, 12 Drawing Sheets

U.S. PATENT DOCUMENTS

| | | | |
|---|---|---|---|
| 7,211,926 B2 | 5/2007 | Quevy et al. | |
| 7,215,061 B2 | 5/2007 | Kihara et al. | |
| 7,247,246 B2 | 7/2007 | Nasiri et al. | |
| 7,250,353 B2 | 7/2007 | Nasiri et al. | |
| 7,352,608 B2 | 4/2008 | Mohanty et al. | |
| 7,436,272 B2 | 10/2008 | Fujii et al. | |
| 7,442,570 B2 | 10/2008 | Nasiri et al. | |
| 7,492,241 B2 | 2/2009 | Piazza et al. | |
| 7,504,909 B2 | 3/2009 | Tada | |
| 7,621,183 B2 | 11/2009 | Seeger et al. | |
| 7,724,103 B2 | 5/2010 | Feng et al. | |
| 7,739,906 B2* | 6/2010 | Hatanaka et al. | 73/146 |
| 7,791,432 B2 | 9/2010 | Piazza et al. | |
| 7,928,584 B2* | 4/2011 | O Suilleabhain et al. | 257/778 |
| 2005/0073078 A1 | 4/2005 | Lutz et al. | |
| 2006/0214745 A1 | 9/2006 | Park et al. | |
| 2007/0044565 A1 | 3/2007 | Aratake | |
| 2007/0092179 A1* | 4/2007 | Park et al. | 385/14 |
| 2007/0188054 A1* | 8/2007 | Hasken et al. | 310/348 |
| 2007/0295456 A1* | 12/2007 | Gudeman et al. | 156/379.7 |
| 2008/0136542 A1 | 6/2008 | Hirama | |
| 2008/0143217 A1 | 6/2008 | Ho et al. | |
| 2008/0196930 A1* | 8/2008 | Tuominen et al. | 174/260 |
| 2008/0204153 A1 | 8/2008 | Yoshida et al. | |
| 2008/0272852 A1 | 11/2008 | Six | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0243747 A1 | 10/2009 | Gaidarzhy et al. | |
| 2009/0294638 A1 | 12/2009 | Mohanty et al. | |
| 2010/0007443 A1 | 1/2010 | Mohanty et al. | |
| 2010/0134207 A1 | 6/2010 | Mohanty et al. | |
| 2010/0155883 A1 | 6/2010 | Wenzler et al. | |
| 2010/0301703 A1* | 12/2010 | Chen et al. | 310/318 |
| 2010/0315179 A1* | 12/2010 | Schoepf et al. | 333/186 |
| 2011/0187227 A1 | 8/2011 | Chen et al. | |

FOREIGN PATENT DOCUMENTS

| | | |
|---|---|---|
| WO | WO 2006/000611 A1 | 1/2006 |
| WO | WO 2006/083482 A2 | 8/2006 |
| WO | WO 2008/149298 A1 | 12/2008 |
| WO | WO 2010/011288 A1 | 1/2010 |

OTHER PUBLICATIONS

International Search Report and Written Opinion for International Application No. PCT/US2010/000955 mailed Jun. 23, 2010.

International Search Report and International Preliminary Report on Patentability for PCT/US2006/021298 mailed Nov. 6, 2006 and Dec. 6, 2007 respectively.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Office Action from U.S. Appl. No. 13/466,767 dated Nov. 28, 2012.

* cited by examiner

INTEGRATION OF PIEZOELECTRIC MATERIALS WITH SUBSTRATES

RELATED APPLICATIONS

The present application claims the benefit under 35 U.S.C. §120 as a continuation-in-part of U.S. patent application Ser. No. 12/750,768, filed Mar. 31, 2010 under and entitled "Integration of Piezoelectric Materials with Substrates," which is hereby incorporated herein by reference in its entirety. U.S. patent application Ser. No. 12/750,768 claims priority under 35 U.S.C. §119(e) to U.S. patent application Ser. No. 61/165,405, filed Mar. 31, 2009 under and entitled "Integration of Piezoelectric Materials With Substrates", which is hereby incorporated herein by reference in its entirety.

The present application also claims the benefit under 35 U.S.C. 119(e) of U.S. Provisional Application Ser. No. 61/368,227, filed on Jul. 27, 2010, under and entitled "Wafer Level Stacking of MEMS Resonator with IC Wafer," which is hereby incorporated herein in its entirety.

FIELD

The technology described herein relates to integration of piezoelectric materials with substrates.

RELATED ART

Conventional micromechanical resonators are physical structures that are designed to vibrate, often at high frequencies. Such resonators may be incorporated into a variety of devices such as timing oscillators, mass sensors, gyros, accelerometers, switches, and electromagnetic fuel sensors, amongst others.

Many conventional mechanical resonators are formed of quartz, due to the temperature-stability and high Q exhibited by the quartz crystal. Such conventional quartz resonators are individually packaged, with minimal or no electrical circuitry included within the package. Rather, connections to control circuitry are made externally to the packaged resonators.

Many of the products which utilize conventional quartz resonators (e.g., components within timing circuits, telecomm networks, toys, etc.) are frequently undergoing reductions in size, driven partially by the ongoing reductions in size of present-day silicon based integrated circuit (IC) technology. However, conventional fabrication and encapsulation methods limit packaged quartz crystal resonators to a size of about 2.5 mm×2.0 mm, making their integration with present-day products, as well as tomorrow's products of even smaller sizes, difficult.

SUMMARY

Devices including piezoelectric material structures integrated with substrates are described. Methods of fabricating such devices are also described.

In one aspect, a packaged micromechanical resonator is provided. In some embodiments, the packaged micromechanical resonator comprises a substrate; a cap comprising integrated circuitry; a first portion of an electrically conductive material between the substrate and the cap, disposed such that the substrate, the cap, and the first portion of the electrically conductive material define a sealed, enclosed volume; a micromechanical resonator comprising a piezoelectric material disposed within the enclosed volume; and a second portion of the electrically conductive material between the substrate and the cap constructed and arranged such that a signal can be transmitted between the micromechanical resonator and the integrated circuitry through the second portion of the electrically conductive material.

The packaged micromechanical resonator may comprise, in some cases, a substrate; a cap comprising integrated circuitry; a first portion of an electrically conductive material between the substrate and the cap, disposed such that the substrate, the cap, and the first portion of the electrically conductive material define a sealed, enclosed volume; a micromechanical resonator disposed within the enclosed volume; and a second portion of the electrically conductive material between the substrate and the cap constructed and arranged such that a signal can be transmitted between the micromechanical resonator and the integrated circuitry through the second portion of the electrically conductive material; wherein the first and/or second portions of the electrically conductive material have an average thickness of at least about 5 microns.

In one set of embodiments, the packaged micromechanical resonator can comprise a substrate; a cap comprising integrated circuitry; a first portion of an electrically conductive material between the substrate and the cap, disposed such that the substrate, the cap, and the first portion of the electrically conductive material define a sealed, enclosed volume; a micromechanical resonator configured to oscillate in plane disposed within the enclosed volume; and a second portion of the electrically conductive material between the substrate and the cap constructed and arranged such that a signal can be transmitted between the micromechanical resonator and the integrated circuitry through the second portion of the electrically conductive material.

In another aspect, a method of packaging a micromechanical resonator is described. In one set of embodiments, the method comprises providing a substrate on which a micromechanical resonator is disposed; providing a cap comprising integrated circuitry; positioning first and second portions of an electrically conductive material between the substrate and the cap; and modifying the first and second portions of the electrically conductive material such that the first portion of the electrically conductive material produces a seal between the substrate and the cap and such that a signal can be transmitted between the micromechanical resonator and the integrated circuitry through the second portion of the electrically conductive material.

BRIEF DESCRIPTION OF THE DRAWINGS

Various embodiments of the technology will be described with respect to the following figures. It should be appreciated that the figures are not necessarily drawn to scale.

DETAILED DESCRIPTION

Device structures including piezoelectric materials integrated with substrates are described, as well as methods of forming the same. In some embodiments, the piezoelectric device structures include single crystal piezoelectric resonators integrated with one or more substrates, for example to form an engineered substrate. One or more of the substrates may include circuitry coupled to the piezoelectric device structures, for example to control operation of the piezoelectric device structure, and/or to detect/sense operation of the piezoelectric device structure. The piezoelectric device structures may be fabricated by bonding a wafer of piezoelectric material to a substrate wafer, and then forming the piezoelectric device structure from the wafer of piezoelectric material. In some embodiments, the piezoelectric material is quartz, which is bonded to a silicon substrate to form an engineered substrate. The piezoelectric device structure may be a quartz resonator formed from the quartz wafer.

It should be appreciated that the use of the term "coupled" herein covers both direct connection of components as well as interconnection of components through one or more intermediate components (e.g., transistors, resistors, capacitors, etc.). Also, the phrase "integrated with" as used herein refers to the interconnection of components and/or material layers such that the components/layers being interconnected form a single structure. For example, material layers (e.g., piezoelectric material layers) integrated with a substrate may form an engineered substrate.

Various aspects of the technology will now be described in greater detail. These aspects may be used alone, all together, or in any combination of two or more, as the technology is not limited in this respect.

Figure 1:
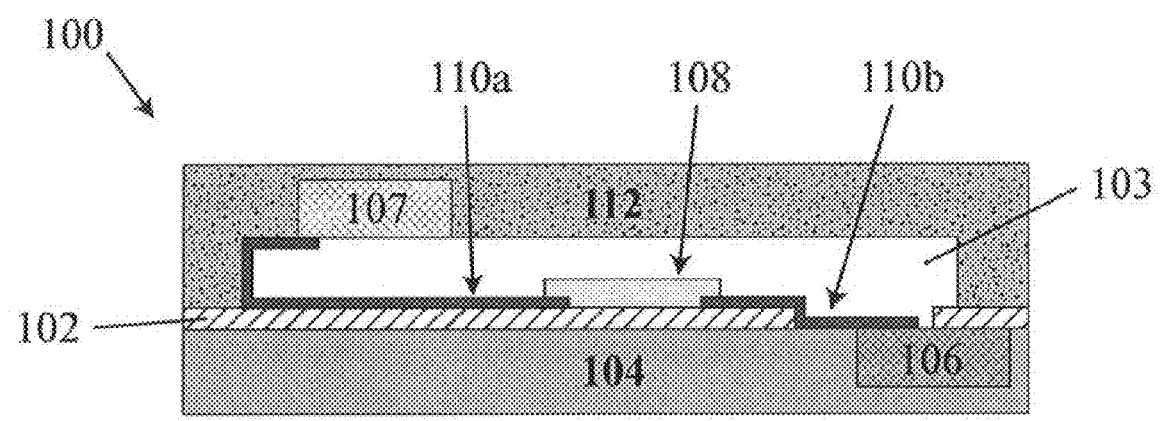
FIG. 1 illustrates a device having a piezoelectric material structure integrated with a substrate and cap, on both of which integrated circuitry is formed, according to one embodiment.

FIG. 1 illustrates a device 100 comprising a piezoelectric material structure 102 integrated with a substrate 104. Integrated circuitry 106 formed on the substrate 104 may be connected to circuitry 108 on the piezoelectric material structure 102 by interconnection 110b. A cap 112 may also be included, and may form a cavity 103. Integrated circuitry 107 may be formed on the cap 112 and connected to circuitry 108 by interconnection 110a. It should be appreciated that the integrated circuitry 106 and 107 may be any size relative to the substrate 104 and/or the cap 112, including being smaller than those structures. In some instances, the integrated circuitry may be an application specific integrated circuit (ASIC).

The piezoelectric material structure 102 may be a resonator, a filter, a sensor, or any other suitable structure, as those listed are merely non-limiting examples. Likewise, the piezoelectric material structure 102 may, in some situations, preferably comprise quartz, but may alternatively comprise $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments the piezoelectric material structure may comprise single crystal piezoelectric material (e.g., single crystal quartz), although not all embodiments are limited in this respect.

The piezoelectric material structure may be integrated with the substrate 104 by bonding a piezoelectric material wafer to the substrate 104 and then forming the piezoelectric material structure 102 from the piezoelectric material wafer. Thus, the piezoelectric material structure and the substrate 104 may form an engineered substrate. Other techniques for integrating the piezoelectric material structure may also be used, as the various aspects described herein relating to piezoelectric material structures integrated with substrates are not limited to the manner in which the two are integrated.

The substrate 104 may be formed of silicon, may comprise silicon (e.g., silicon, silicon carbide (SiC), etc.), or may be formed of any other suitable material. According to some embodiments, the substrate 104 may be formed of a semiconductor material, and in some embodiments may be formed of a single crystal semiconductor material (e.g., single crystal silicon). In some embodiments, the substrate 104 comprises a different material than that of the piezoelectric material structure 102. For example, the piezoelectric material structure may comprise single crystal quartz while the substrate 104 does not comprise quartz, e.g., the substrate may be a silicon substrate, according to one non-limiting embodiment. However, other material combinations are also possible.

The piezoelectric material structure 102 may be electrically interconnected with circuitry on the substrate 104. For example, as shown, integrated circuitry 106 (e.g., integrated silicon circuitry, CMOS circuitry, biCMOS circuitry, SiGe circuitry, GaAs circuitry, InP circuitry, etc.) may be formed on the substrate 104. The integrated circuitry may be configured to control and/or detect/sense operation of the piezoelectric material structure 102, and therefore may include compensation circuitry, synthesizer circuits, or any other suitable control and/or detection circuitry, or circuitry for any supporting functions.

The piezoelectric material structure 102 itself may include one or more electrical components (e.g., electrodes) or circuitry 108, for example to control (e.g., actuate and/or detect) the piezoelectric material structure. In the non-limiting example of FIG. 1, interconnection 110b couples the integrated circuitry 106 to the circuitry 108. The interconnection may be a conductive trace (e.g., metal traces or semiconductor traces), or may be any suitable interconnection structure. In this manner, electrical communication may take place between the piezoelectric material structure 102 and the substrate 104. Similar operation may occur between the integrated circuitry 107 on cap 112 and the circuitry 108 via interconnection 110a. As a non-limiting example, the piezoelectric material structure 102 may be a mechanical resonator (e.g., a mechanical resonator formed of single crystal quartz, or any other suitable piezoelectric material), and the integrated circuitry 106 and/or 107 may operate to actuate the resonator and/or to detect vibration of the resonator.

It should be appreciated that resonators (e.g., quartz resonators) are merely one non-limiting example of a type of piezoelectric material structure 102, and that the function of the integrated circuitry 106 and 107 may depend on the particular type of piezoelectric material structure. For example, if the piezoelectric material structure 102 is a sensor, the integrated circuitry 106 and/or 107 may operate to detect and process output signals of the sensor. Other functions of the integrated circuitry 106 and 107 are also possible. It should also be appreciated that not all embodiments include integrated circuitry on both the substrate and cap. For example, differing embodiments may include integrated circuitry on only one of the substrate and cap, on both the substrate and cap, or on neither of the substrate and cap.

In the non-limiting embodiment of FIG. 1, a cap wafer 112 is also included. The cap wafer may facilitate formation of a hermetic seal (inert or non-inert) (e.g., a vacuum seal) for the piezoelectric material structure, or may serve any other suitable function. In some embodiments, the cap wafer 112 may include circuitry 107, for example like integrated circuitry 106 on substrate 104, to communicate with the piezoelectric material structure 102 and/or the integrated circuitry 106. Similarly, in some embodiments, the cap wafer may include integrated circuitry coupled to the piezoelectric material structure, while the substrate 104 may not. It should be appreciated, however, that the cap wafer 112 is optional, and therefore not all aspects of the technology described herein implement one.

It should also be appreciated that various additional or alternative features may optionally be included in the device 100. Also, the cavity 103 may be formed in any suitable manner, and may not be included in all embodiments. For example, the cavity 103 may be formed before bonding the cap. In some embodiments, buried cavities in substrates and/or caps are formed by suitable etching of a substrate and/or cap prior to bonding to other structures (e.g., forming the cavity in the substrate prior to bonding by etching with $XeF_2$ or $SF_6$, or in any other suitable manner) or after bonding the cap or substrate to a wafer of piezoelectric material (e.g., by selectively etching the substrate after bonding). Alternatively, if the piezoelectric material structure 102 is to be suspended, such a result may be achieved using various alternative configurations. For example, a sacrificial layer (e.g., gold, aluminum, or any other suitable sacrificial layer) may be formed and then removed (e.g., after bonding substrate 104 to a wafer of piezoelectric material) to create an air gap between the piezoelectric material structure and the substrate 104, even though no cavity may be formed within the substrate 104 itself. Other configurations are also possible, and it should be appreciated that the various aspects described herein are not limited to use with suspended piezoelectric material structures, and when such structures are used, are not limited to suspending the structure in any particular manner.

Figure 2:
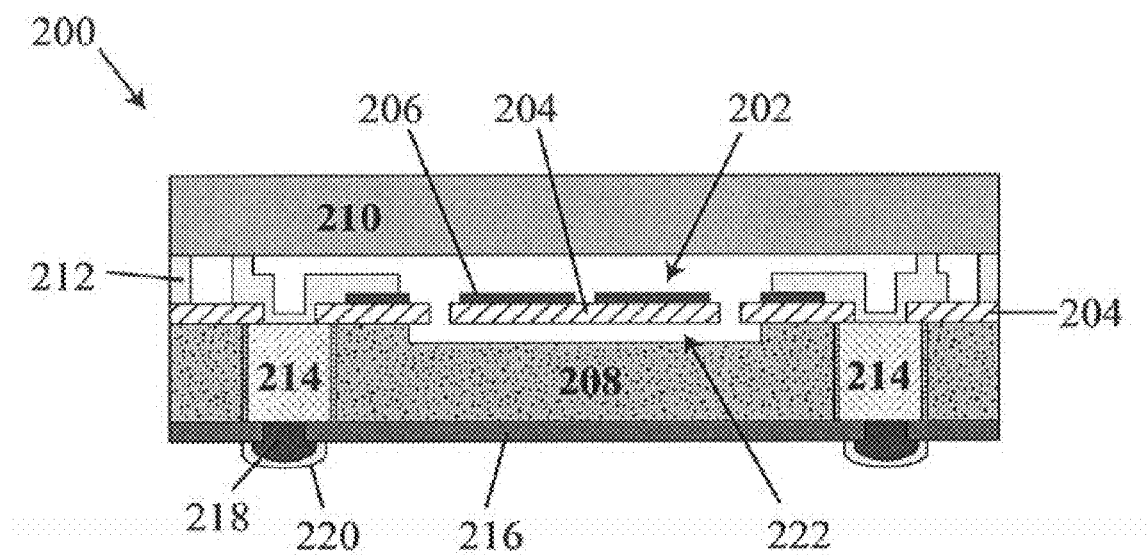
FIG. 2 illustrates a device having a piezoelectric resonator integrated with a substrate, according to one embodiment.

FIG. 2 illustrates a cross-sectional view of a non-limiting example of a device in which the piezoelectric material structure is a mechanical resonator. As shown, the device 200 comprises a mechanical resonator 202 which may be formed of a piezoelectric material 204 and may include one or more electrodes 206. The piezoelectric material 204 may comprise quartz, single crystal quartz, or any other suitable piezoelectric material (e.g., aluminum nitride (AlN), zinc oxide (ZnO), cadmium sulfide (CdS), lead titanate ($PbTiO_3$), lead zirconate titanate (PZT), lithium niobate ($LiNbO_3$), lithium tantalate ($LiTaO_3$), potassium niobate ($KNbO_3$), $Li_2B_4O_7$, langasite ($La_3Ga_5SiO_{14}$), gallium arsenside (GaAs), barium sodium niobate, bismuth germanium oxide, indium arsenide, indium antimonide, or any other non-centrosymmetric material), either in substantially pure form or in combination with one or more additional materials. It may be integrated with a substrate 208, for example by bonding, or in any other suitable manner, for example to form an engineered substrate. In the non-limiting example of FIG. 2, the substrate 208 has a cavity 222 formed therein, above which the resonator 206 is suspended. However, other configurations are also possible, as the various aspects described herein are not limited to inclusion of cavities in substrates and/or using suspended piezoelectric material structures.

The mechanical resonator 202 may be any type of mechanical resonator, such as a quartz resonator, a plate acoustic wave resonator, a flexural mode resonator, a bulk acoustic wave (BAW) resonator, a surface acoustic wave (SAW) resonator, a film bulk acoustic resonator (FBAR), or any other suitable resonator, as the various aspects described herein are not limited in this respect. Suitable resonators have been described, for example, in PCT Patent Publication No. WO 2006/083482, and in U.S. patent application Ser. No. 12/142,254, filed Jun. 19, 2008 and published as U.S. Patent Application Publication No. 2009-0243747-A1, all of which are incorporated herein by reference in their entireties. In some embodiments, the mechanical resonator may be formed of two or more materials, for example using two or more material layers. In some embodiments, the mechanical resonator may be a solidly mounted resonator (SMR), for example comprising a piezoelectric material bonded onto a stack of layers having alternating low and high acoustic impedances. Such a stack may be referred to as a mirror stack, and may be formed on a substrate.

The mechanical resonator may be actuated and/or detected in any suitable manner, including, but not limited to, being actuated and/or detected by piezoelectric techniques, electrostatic techniques, magnetic techniques, thermal techniques, piezoresistive techniques, any combination of those techniques listed, or in any other suitable manner.

In one embodiment, the mechanical resonator (and more particularly, an active layer of the mechanical resonator, such as a piezoelectric layer of a piezoelectric resonator) is configured (e.g., by suitable shaping, dimensioning, and arrangement of the components of the micromechanical resonating structure) to support Lamb waves when excited, e.g., when excited by an electric field applied across its thickness or in any other suitable direction. Lamb waves are one non-limiting example of a mode of operation which may be exhibited by mechanical resonators according to the aspects described herein. According to other embodiments, the mechanical resonator may be configured to operate in a contour mode, bulk mode, plate mode, flexural mode, any resonant mode of the following resonating structure shapes: any antenna type geometry; beams; cantilevers; free-free bridges; free-clamped bridges; clamped-clamped bridges; discs; rings; prisms; cylinders; tubes; spheres; shells; springs; polygons; diaphragms; and tori; or any other suitable mode. In some embodiments, the mechanical resonator may be substantially planar and may be configured to exhibit in-plane vibration as opposed to out-of-plane vibration.

The mechanical resonator may have any resonance frequency. For example, the frequency of the mechanical resonator may be between 1 kHz and 10 GHz. In some embodiments, the frequencies of operation of the mechanical resonator are in the upper MHz range (e.g., greater than 100 MHz), or at least 1 GHz (e.g., between 1 GHz and 10 GHz). In some embodiments, the output signal produced by the mechanical resonator may have a frequency of at least 1 MHz (e.g., 13 MHz, 26 MHz) or, in some cases, at least 32 kHz. In some embodiments, the operating frequency may range from 30 to 35 kHz, 60 to 70 kHz, 10 Mhz to 1 GHz, 1 GHz to 3 GHz, 3 GHz to 10 GHz, or any other suitable frequencies.

The substrate 208 may be a semiconductor substrate (e.g., silicon, SiC, etc.), or may comprise any other suitable material, either in substantially pure form or in combination with one or more additional materials. In some embodiments, the substrate 208 may comprise single crystal material. For example, the substrate 208 may be a single crystal silicon substrate.

The device 200 further comprises a cap 210. The cap 210 may facilitate formation of a hermetic seal (creating either an inert or non-inert environment) for the resonator 202, or may serve any other suitable purpose. For example, the cap may be bonded to the substrate and/or the piezoelectric material, as described below, to form a vacuum environment for the mechanical resonator. However, not all hermetic seals necessarily result in creation of a vacuum environment. According to some non-limiting embodiments, circuitry (e.g., integrated circuitry, such as CMOS circuitry, biCMOS circuitry, InP circuitry, etc.) may be formed on the cap 210, which circuitry may be coupled to the resonator 202 (e.g., to the electrode 206 of the resonator 202) to communicate with the resonator 202. Thus, according to one non-limiting embodiment, the cap 210 may be a complementary metal oxide semiconductor (CMOS) cap, with integrated circuitry formed thereon. In FIG. 2, the cap 210 is bonded to the substrate 208 and piezoelectric material 204 by a metallization layer 212. However, other manners of bonding the cap 210 to the other components of the device 200 may be utilized, and other types of bonding materials (e.g., other than metal) may be used.

As mentioned with respect to FIG. 1, devices comprising piezoelectric material structures integrated with substrates may be coupled to circuitry (e.g., integrated circuitry) on the substrate(s). The circuitry may control operation of the piezoelectric material structure (e.g., may actuate the piezoelectric material structure), may detect operation of the piezoelectric material structure (e.g., may detect vibration of the mechanical resonator 202), may process input and output signals sent to/from the piezoelectric material structures, or may perform any other suitable functions.

In device 200, several components provide electrical access to the mechanical resonator 202. Access may be provided to circuitry on the substrate 208, circuitry on the cap 210 (if any), and/or circuitry external to the device 200. For example, in addition to providing bonding, the metallization layer 212 may also provide electrical connection to the resonator 202, and in particular to the electrode 206. The metallization layer 212 may therefore provide an electrical path to circuitry on substrate 208 and/or circuitry on cap 210. According to the non-limiting embodiment of FIG. 2, electrical connection to the resonator 202 is also provided from a backside of the substrate 208, by way of two thru-silicon vias 214 (TSV). The TSVs 214 may comprise doped silicon having any suitable doping concentration to make the silicon suitably conductive, doped polysilicon with any suitable doping concentration, copper, or any other suitable conductive material. Thus, electrical signals may be sent to/from the resonator 202 by way of the TSVs, and as such, the TSVs may allow circuits external to the device 200 to communicate with the resonator 202. It should be appreciated that any number of such TSVs may be used (e.g., one, two, or many more than two), in those embodiments which utilize TSVs, and that not all embodiments include TSVs. According to some embodiments, the TSVs may function to communicate control and/or detection signals with the resonator 202. According to some embodiments, control and detection of the resonator may be substantially performed by circuits on the substrate 208 and/or cap 210, and only processed signals (e.g., output signals) may be sent external to the device 200 by the TSVs. Other communication schemes are also possible.

The device 200 illustrated in FIG. 2 further comprises additional layers 216, 218, and 220. Layer 216 may be an insulation layer (e.g., SiO$_2$), formed in any suitable manner (e.g., deposition or growth), and etched in any suitable manner for subsequent formation of layers 218 and 220. The layers 218 and 220 may represent under-bump metallization (UBM) to provide electrical access to the mechanical resonator and/or integrated circuitry of device 200 from the backside of the substrate 208, and thus may be formed of any suitable materials and in any suitable manner. For example, the layer 218 may be electroless plated nickel and the layer 220 may be electroless plated gold, although other materials and methods of formation are also possible.

It should be appreciated that the device 200 may take any suitable dimensions, and that the various aspects of the technology described herein are not limited to devices of any particular sizes. For example, in some non-limiting embodiments, the mechanical resonator 202 may have a large dimension (e.g., length, width, diameter, circumference, etc.) of less than approximately 1000 microns, less than 100 microns, less than 50 microns, or any other suitable value. It should be appreciated that other sizes are also possible.

Figure 3:
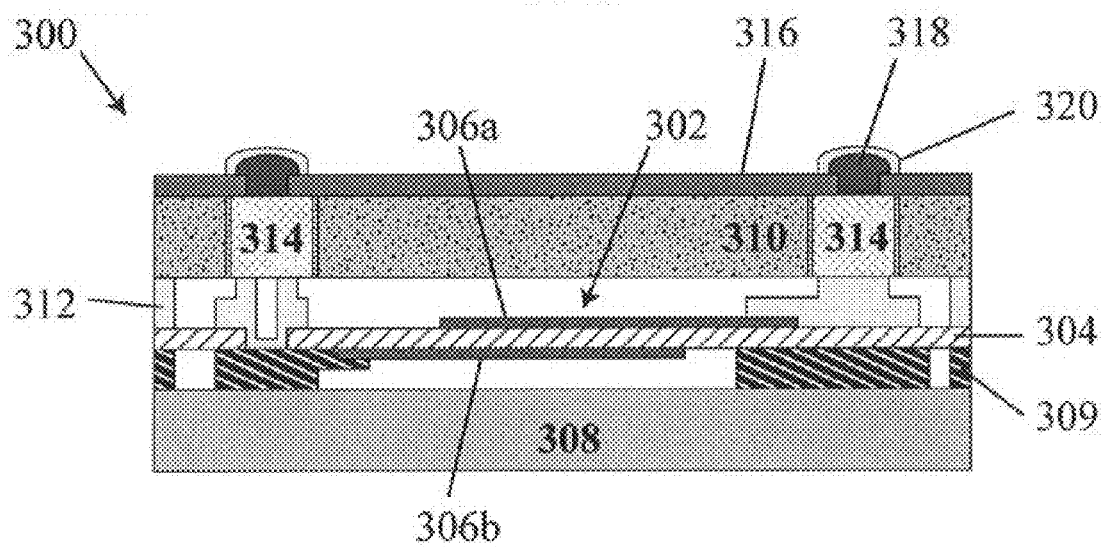
FIG. 3 illustrates an alternative device including a piezoelectric resonator integrated with a substrate, according to one embodiment.

FIG. 3 illustrates a cross-sectional view of an alternative device in which the piezoelectric material structure is a mechanical resonator. The device 300 comprises a mechanical resonator 302 comprising a piezoelectric material 304 and two electrodes; a top electrode 306a and a bottom electrode 306b. The piezoelectric material may be any suitable type of material, such as any of the materials mentioned above with respect to piezoelectric material 204 of FIG. 2. The piezoelectric material 304 is integrated with a substrate 308 by a bonding layer 309. The bonding layer may be formed of a conductive material in some embodiments (e.g., copper, or any other suitable conductive bonding material), but is not limited in this respect. As a result of the bonding layer 309, the mechanical resonator 302 is suspended above the substrate 308. Thus, in the non-limiting example of FIG. 3, no cavity is formed in the substrate 308.

The substrate 308 may be any suitable type of substrate. For example, the substrate 308 may comprise any of the materials previously described in connection with substrate 208 of FIG. 2, or any other suitable material. The substrate 308 may be a CMOS substrate, and may, in some embodiments, have circuitry formed thereon. However, in some embodiments, the substrate 308 does not have circuitry formed thereon. Any circuitry formed on substrate 308 may be coupled to the mechanical resonator 302 and may perform any suitable function (e.g., controlling operation of the mechanical resonator, detecting vibration of the mechanical resonator, any supporting functions, etc.).

The device 300 further comprises a cap 310. As with cap 210, the cap 310 may facilitate formation of a hermetic seal (e.g., a vacuum seal) for the resonator 302, or may serve any other suitable purpose, such as those described above in connection with cap 210 of FIG. 2. Thus, according to one non-limiting embodiment, the cap 310 may be a complementary metal oxide semiconductor (CMOS) cap, with integrated circuitry formed thereon. However, not all embodiments are limited in this respect.

In FIG. 3, the cap 310 is bonded to the piezoelectric material 304 by a metallization layer 312. However, other manners of bonding the cap 310 to the other components of the device 300 may be utilized, and other types of bonding materials (e.g., other than metal) may be used.

As mentioned with respect to FIGS. 1 and 2, devices comprising piezoelectric material structures integrated with substrates may be coupled to circuitry (e.g., integrated circuitry) on one or more of the substrate(s). In device 300, several components allow electrical connection to the mechanical resonator 302, and in particular to the top electrode 306a and bottom electrode 306b. For example, in addition to facilitating bonding, the metallization layer 312 is configured to provide electrical connection to the resonator 302. In the non-limiting embodiment of FIG. 3, electrical connection to the resonator 302 is provided from a backside of the cap 310, by way of two thru-silicon vias 314 (TSV). The TSVs 314 may be formed of any suitable materials, such as any of those previously described with respect to TSVs 214, or any other suitable material. The TSVs 314 may perform any of the functions previously described with respect to TSVs 214. It should be appreciated that any number of such TSVs may be used.

The device 300 illustrated in FIG. 2 further comprises additional layers 316, 318, and 320, which may be identical to, or similar to, layers 216, 218, and 220 of device 200. Thus, the layer 316 may be an insulation layer formed in any suitable manner Layers 318 and 320 may be electroless plated nickel and gold, respectively, or may be any other suitable materials. Thus, the layers 318 and 320 may provide electrical connection to the mechanical resonator 302.

As with device 200 in FIG. 2, it should be appreciated that the device 300 may take any suitable dimensions, such as any of the dimensions listed with respect to device 200, or any other suitable dimensions.

Devices having piezoelectric material structures integrated with substrates may be fabricated in any suitable manner, and the various devices described herein are not limited to being fabricated in any particular manner. According to one aspect of the technology described, fabrication techniques enabling wafer-level processing (as opposed to separate fabrication of individual devices) are provided. The wafer-level processing may utilize one or more steps available in silicon processing and microelectromechanical systems (MEMS) processing schemes, and in some embodiments all steps of fabrication may be performed using conventional silicon processing techniques. In those situations in which wafer-level processing is performed, individual devices may be produced by dicing the processed wafers, though it should be appreciated that not all embodiments are limited in this respect.

Figure 4:
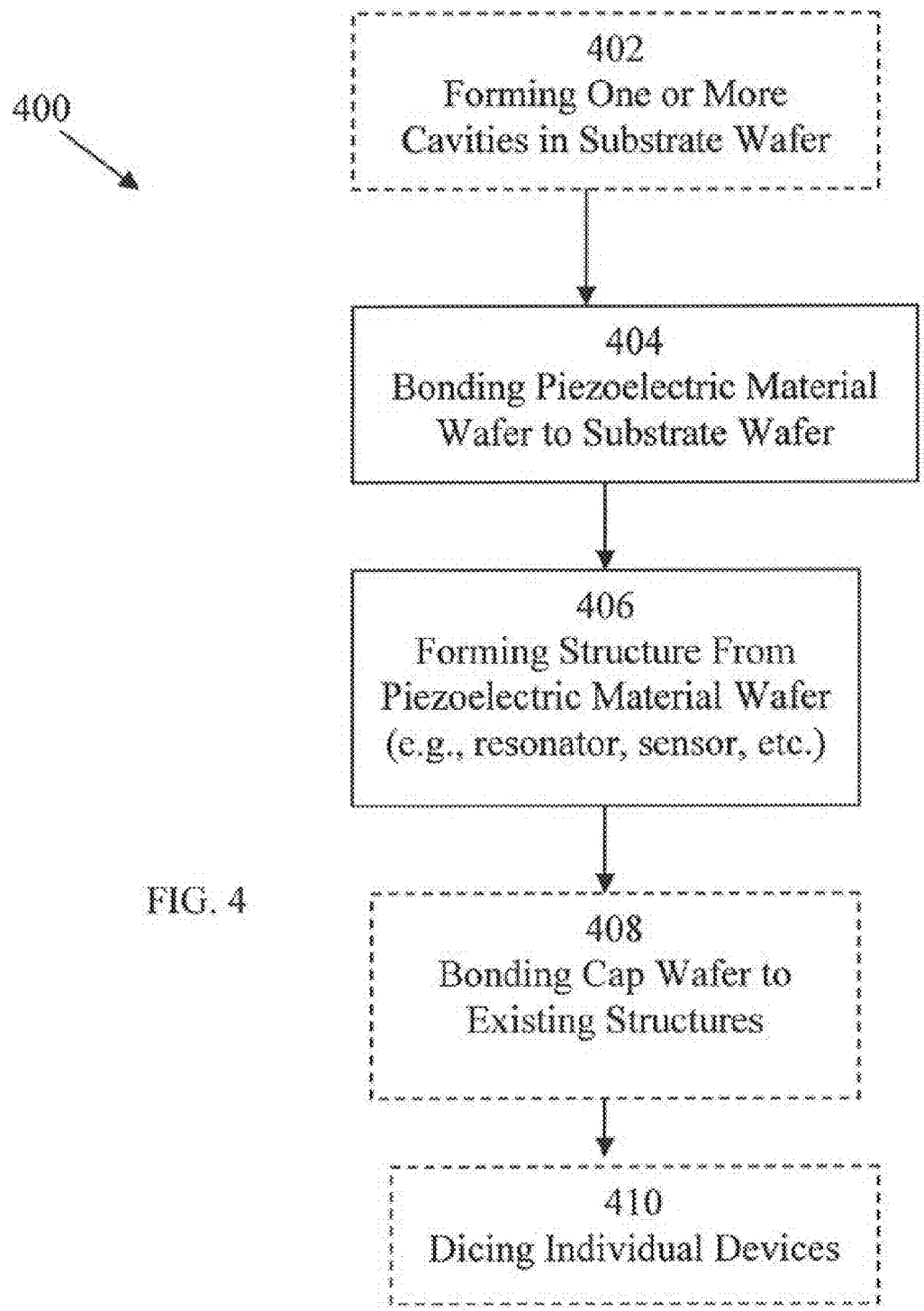
FIG. 4 is a flowchart illustrating a fabrication routine for forming piezoelectric material structures integrated with substrates, according to one embodiment.

Referring to FIG. 4, a non-limiting example of a processing sequence for wafer-level processing of devices, like devices 100, 200, and 300, is shown. Those steps which are optional are shown in boxes with a dashed outline.

The method 400 may begin at 402 by forming one or more cavities in a substrate wafer. For example, as seen with respect to FIG. 2, a device 200 may include a cavity 222. Thus, for wafer-level processing of such devices, cavities 222 may be formed in a suitable substrate. However, as has been seen with respect to device 300 in FIG. 3, not all embodiments of devices described herein include cavities within a substrate. In addition, it should be appreciated that the techniques described herein apply to devices in which a piezoelectric material structure is not suspended at all (e.g., a multi-layered surface acoustic wave device, or other devices not requiring a suspended structure). Thus, the formation of cavities at 402 is optional.

The method 400 continues at 404 by bonding a piezoelectric material wafer to a substrate wafer (e.g., the substrate wafer from 402 if step 402 is performed). The piezoelectric material wafer (e.g., a wafer of single crystal quartz, in one non-limiting embodiment) may have polished surfaces in some embodiments, and may be bonded to the substrate wafer (e.g., a silicon wafer) using any suitable bonding technique. If step 402 has previously been performed, then the bonding at step 404 may result in a plurality of buried cavities.

It should also be appreciated that one or more structures may be formed on the piezoelectric material wafer and/or the substrate wafer prior to bonding of the two. For example, electrodes may be formed on the piezoelectric material wafer prior to the bonding. However, not all embodiments are limited in this respect.

Subsequently, at 406, a piezoelectric material structure (e.g., mechanical resonators 202 and 302) may be formed from the piezoelectric material wafer. The formation of such structures may involve sub-steps such as depositing, patterning, and/or etching of materials, or any suitable combination of such processing steps. Which sub-steps are employed to form the piezoelectric material structure at 406 may depend on the type of structure being formed (e.g., filters, resonators, sensors, etc.).

The formation of a piezoelectric material structure integrated with a substrate may thus be completed at step 406. However, according to some embodiments, devices, such as devices 200 and 300, further comprise cap wafers. Thus, at 408, bonding of a cap wafer to the existing structures (e.g., to the substrate wafer, piezoelectric material wafer, etc.) may optionally be performed. One alternative to using a cap wafer is to deposit a thin film capping layer. Other alternatives are also possible, and according to some embodiments no form of cap is used.

According to one embodiment, the steps of method 400 described thus far may be utilized to form a single device. However, as previously mentioned, according to another embodiment the method 400 may be utilized to perform wafer-level processing resulting in the formation of multiple devices. In such an embodiment, then, the method 400 may optionally include, at 410, dicing the processed wafers to form individual devices. According to some embodiments in which dicing may be employed, the dicing may expose bond pads which may be used, for example, for wirebonding to other integrated circuits. In such embodiments, TSVs may not be included in the device, although diced devices are not limited in this respect.

The devices 200 and 300 of FIGS. 2 and 3 may be fabricated by any suitable processing sequence, and are not limited to being fabricated in any particular manner. For purposes of illustration, one non-limiting example of a processing sequence for forming device 200 is now described in connection with FIGS. 5A-5J. It should be appreciated that the illustrated processing sequence represents a specific, non-limiting implementation of method 400. Furthermore, while FIGS. 5A-5J illustrate the fabrication of a single device, it should be appreciated that the processing steps illustrated may be performed at a wafer level, such that multiple devices may be fabricated at the same time.

Figure 5A:
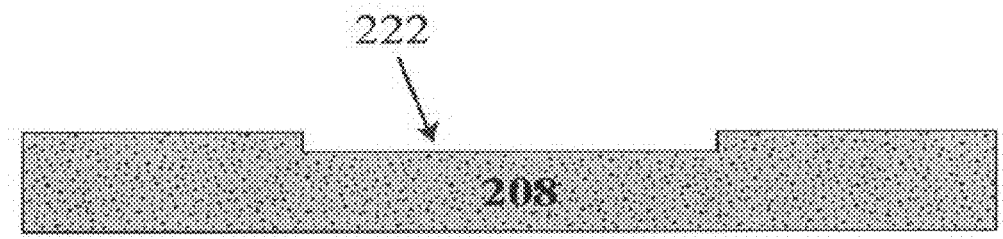
FIGS. 5A-5J illustrate a process sequence for fabricating the device of FIG. 2, according to one embodiment.

Referring to FIG. 5A, the process may begin by forming the cavity 222 in the substrate 208. It should also be appreciated that the substrate 208 may have one or more layers formed thereon, such as an oxide layer or any other suitable layers, which are not shown in FIGS. 5A-5J since such additional layers are optional and are not part of the non-limiting example of FIGS. 5A-5J. In addition, as previously mentioned, in some embodiments the substrate 208 may have integrated circuitry formed thereon. Such integrated circuitry may be formed at any suitable stage of the processing, such as prior to the formation of the cavity 222, or at any other suitable stage of processing.

Figure 5B:
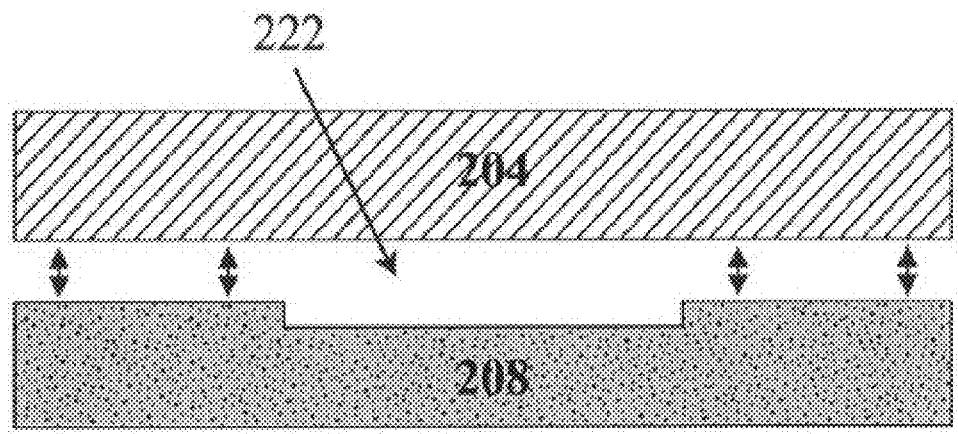

In FIG. 5B, a wafer of piezoelectric material 204 may be bonded to the substrate 208. The bonding of the substrate 208 and the wafer of piezoelectric material 204 may be accomplished by low temperature wafer bonding, or in any suitable manner. In addition, the surfaces of the wafer of piezoelectric material 204 may be polished in some embodiments, either prior to bonding to the substrate 208 or subsequent to the bonding.

As previously mentioned with respect to FIG. 2, some devices according to the aspects described herein may include metal layers (for example, metal traces) designed to align with the cavity 222. Such metal layers may be formed on the substrate 208 and/or on the wafer of piezoelectric material

204. If included, such metal layers may be formed prior to bonding of the substrate 208 with the wafer of piezoelectric material 204. However, such metal layers are optional, and are not included in the non-limiting example of FIGS. 5A-5J.

Figure 5C:
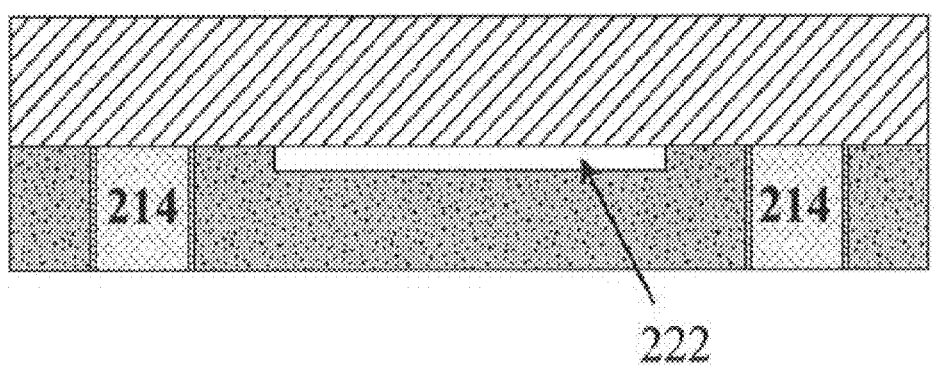

As previously mentioned with respect to FIG. 2, electrical connection to the resonator 202 (not yet formed) may be provided from a backside of the substrate 208. Thus, as shown in FIG. 5C, the substrate 208 may be thinned and TSVs 214 may be formed in the substrate 208. The thinning of the substrate 208 may be accomplished in any suitable manner, and the thinned thickness of the substrate may take any suitable value. For example, the substrate 208 may have a thickness between approximately 400-700 microns, or any other suitable thickness, prior to thinning, and between approximately 300-400 microns, or any other suitable thickness, after thinning. The TSVs 214 may be formed of a conducting material.

It should also be appreciated with respect to FIG. 5C that the cavity 222 becomes a buried cavity when the substrate 208 is bonded to the wafer of piezoelectric material 204.

Figure 5D:
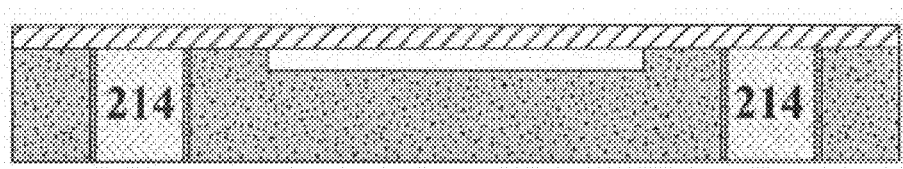

As previously shown with respect to FIG. 2, the device 200 includes a resonator 202 formed by the piezoelectric material 204 and an electrode. According to some embodiments, the resonator may have a thickness less than that of the wafer of piezoelectric material 204 bonded to the substrate 208 in FIG. 5B. Therefore, as shown in FIG. 5D, the wafer of piezoelectric material 204 may be thinned to any suitable thickness. For example, the wafer of piezoelectric material may have a thickness between approximately 350-550 microns, or any other suitable thickness, prior to thinning, and less than approximately 50 microns (e.g., 10 microns, 20 microns, or 30 microns), or any other suitable thickness, after thinning. The thinned thickness may depend on the type of piezoelectric material structure formed (e.g., resonator, filter, sensor, etc.) and the mode and frequency of operation of the structure. For example, for a resonator intended to have a resonant frequency of approximately 100 MHz, the piezoelectric material may be thinned to a final thickness of approximately 16 microns. For a resonator intended to have a resonant frequency of approximately 1 GHz, the piezoelectric material may be thinned to a thickness of approximately 1.6 microns. The thinning may be performed by lapping/grinding and/or chemical etching, or in any other suitable manner. After the thinning is completed, an optional step may be performed to smooth the exposed surface of the piezoelectric material 204, for example by chemical-mechanical polishing (CMP), or in any other suitable manner.

Figure 5E:
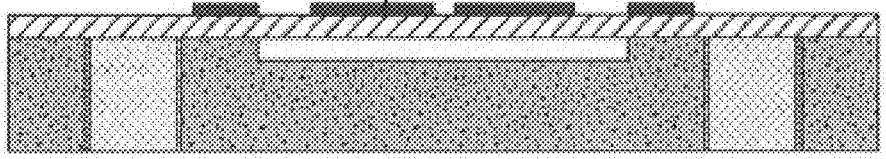

Subsequently, as shown in FIG. 5E, the electrode 206 may be formed by depositing a suitable conducting material and then patterning the material.

Figure 5F:
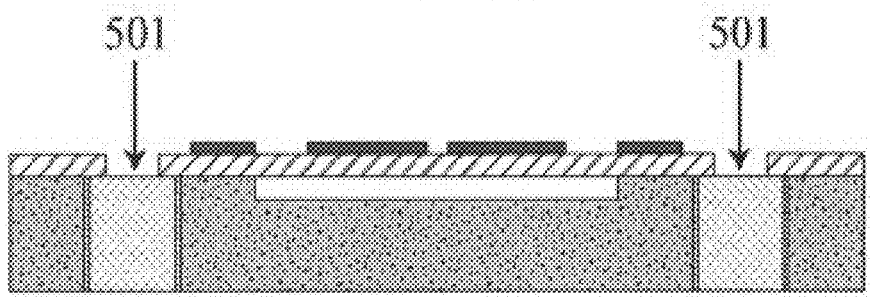

As previously mentioned, electrical connection may be provided to the resonator 202 (not yet formed in FIG. 5E) by way of the TSVs 214 previously formed. Thus, as shown in FIG. 5F, the piezoelectric material 204 may be patterned to form openings 501, to provide interconnection between the TSVs 214 and the electrode 206. The patterning and etching used to form openings 501 may be performed in any suitable manner, as the various aspects described herein are not limited in this respect.

Figure 5G:
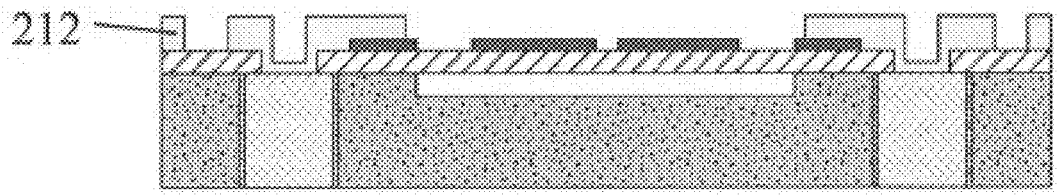

Subsequently, as shown in FIG. 5G, the metallization layer 212 may be deposited and patterned to provide interconnection between the TSVs 214 and the electrode 206, as well as to serve as a seal ring for subsequent bonding of the cap wafer.

Figure 5H:
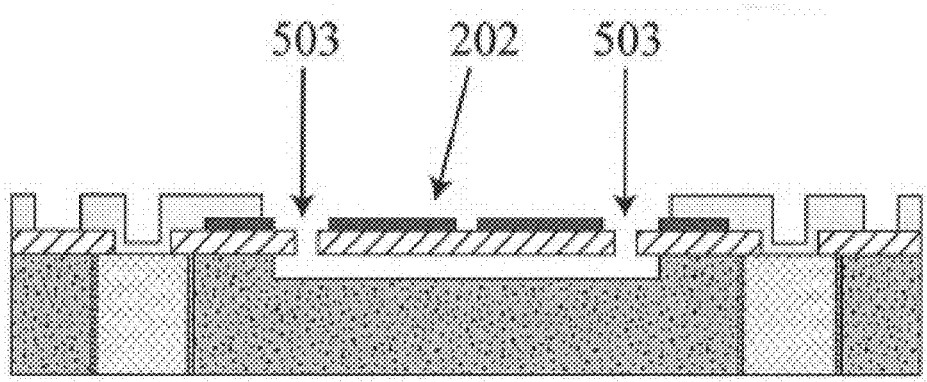

As shown in FIG. 5H, the piezoelectric material 204 may then be etched to suspend the resonator 202 above the cavity 222. Thus, in the cross-section illustrated in FIG. 5H, openings 503 may be formed by the etching process. It should be appreciated that one or more anchor elements may be formed by the etching process of the single crystal piezoelectric material wafer 204, which anchor elements may support the resonator 202, and which are not shown in FIG. 5H. It should be appreciated that the etching of FIG. 5H is optional. For example, such etching may not be performed depending on the type of piezoelectric material structure formed (e.g., a resonator, a filter, a sensor, etc.) and/or the mode of operation of the piezoelectric material structure (e.g., the mode of the resonator may not require the etching of FIG. 5H to be performed). However, for some types of structures and modes of operations (e.g., plate acoustic wave resonators, resonators operated in a flexural mode, etc.) etching may enhance operation of the structure. Thus, the etching may optionally be performed.

Figure 5I:
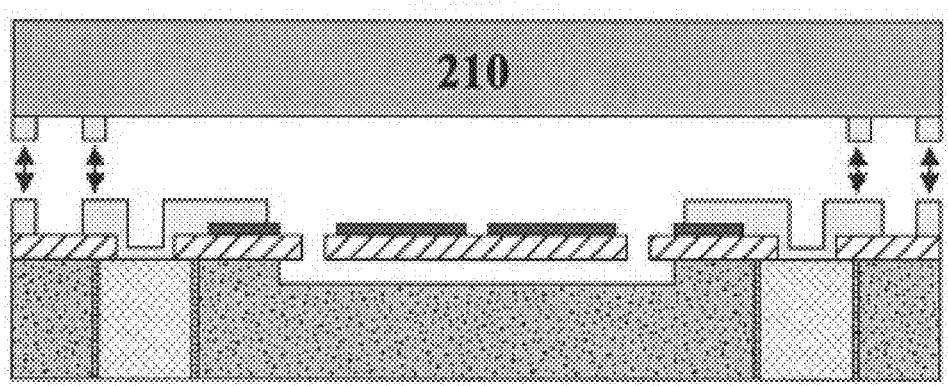

Subsequently, as shown in FIG. 5I, the cap 210 may be bonded to the metallization layer 212, and may serve any of various functions. The bonding may be performed using glass frit, metal thermocompression (e.g., Au—Au), metal eutectic techniques (e.g., Au/Sn), or any other suitable techniques. As mentioned, in some embodiments the cap may include integrated circuitry formed thereon, which circuitry may be formed prior to the bonding illustrated in FIG. 5I, or after such bonding. For example, according to some embodiments, the cap may include integrated circuitry while the substrate may not, or vice versa. Alternatively, both may include integrated circuitry, as the various aspects are not limited in this respect.

Figure 5J:
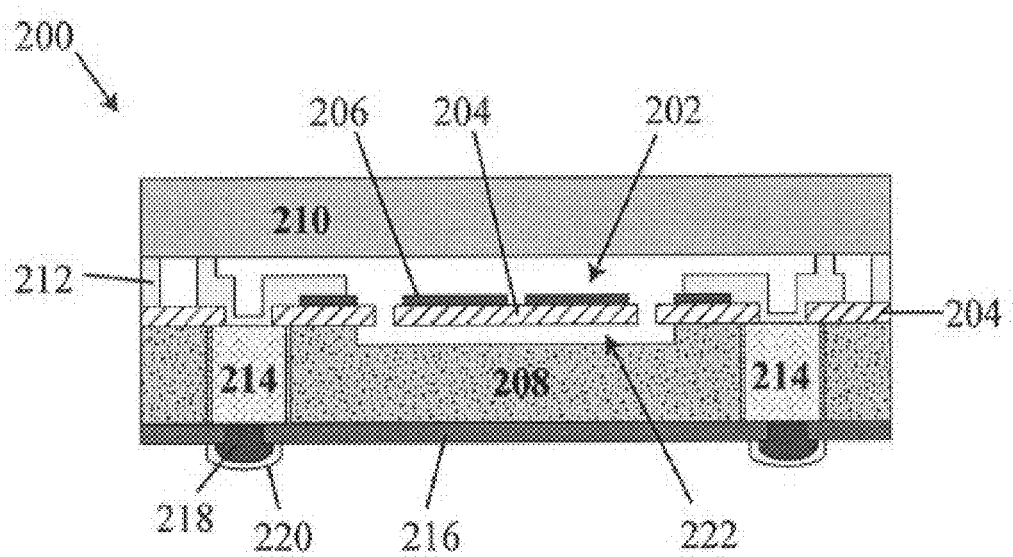

According to some embodiments, the device 200 may be configured to be surface mountable. In such embodiments, under-bump metallization may be used to facilitate bonding and/or electrical connection of the device 200. Thus, as shown in FIG. 5J, the additional layers 216, 218, and 220 may be added to complete the device 200. For example, layer 216 may be formed by deposition, growth, or any other suitable technique. Layers 218 and 220 may be formed by electroless plating, or in any other suitable manner.

As mentioned, the structures illustrated in FIG. 2, and FIGS. 5A-5J may represent only a single device formed during wafer-level processing, such that additional devices may simultaneously be fabricated on the wafers. Therefore, subsequent to the fabrication shown in FIG. 5J, a dicing step may be performed to separate individual devices 200.

FIGS. 6A-6H illustrate one non-limiting process by which the device 300 of FIG. 3 may be fabricated. As with the processing illustrated in FIGS. 5A-5J, the processing illustrated in FIGS. 6A-6H conforms to the general sequence illustrated by method 400 in FIG. 4.

Figure 6A:
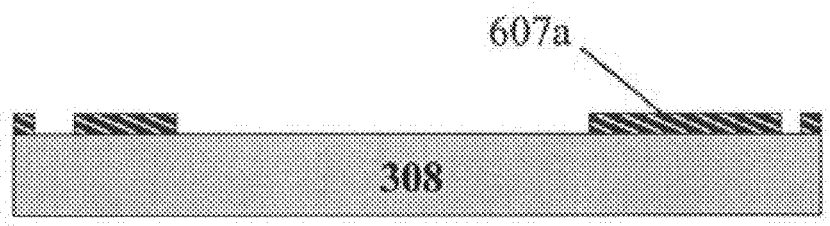
FIGS. 6A-6H illustrate a process sequence for fabricating the device of FIG. 3, according to one embodiment.

As shown in FIG. 6A, the fabrication may begin by depositing and patterning a bonding layer 607a on the substrate 308. As previously explained, the device 300 comprises a bonding layer 309, which in the non-limiting example of FIGS. 6A-6H is formed by two individual bonding layers, 607a and 607b (shown in FIG. 6B). As previously mentioned with respect to FIG. 3, the substrate 308 may be a silicon CMOS substrate, and the bonding layer 607a, which again may be one of two layers used to form the bonding layer 309, may be conductive (e.g., copper) according to some embodiments. The bonding layer 607a may be patterned in any suitable manner.

Figure 6B:
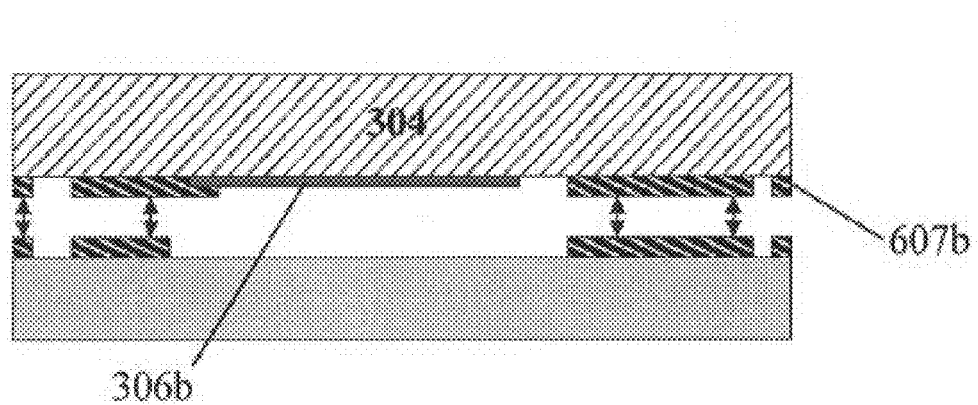

Subsequently, as illustrated in FIG. 6B a wafer of piezoelectric material 304 may be bonded to the substrate 308. The bonding of substrate 308 with the wafer of piezoelectric material 304 may be accomplished with low temperature wafer bonding, or in any other suitable manner, as it should be appreciated that the device 300 is not limited to being fabricated in any particular manner. The substrate 308 may then optionally be thinned, for example to provide an overall chip height below a desired value. However, thinning of the substrate 308 is not performed in the non-limiting sequence of FIGS. 6A-6H.

Prior to the bonding of substrate 308 to the wafer of piezoelectric material 304, the bottom electrode 306b may be formed on the wafer of piezoelectric material 304. In addition, FIG. 6B illustrates that in this non-limiting fabrication example, the wafer of piezoelectric material 304 includes a bonding layer 607b, which may be formed of the same material as bonding layer 607a, or of any other suitable material. It should also be appreciated that in some embodiments the wafer of piezoelectric material 304 has polished surfaces, which may be polished in any suitable manner.

As mentioned with respect to FIG. 3, the device 300 may include a resonator 302, formed at least in part by the piezoelectric material 304. According to some embodiments, the desired thickness of the piezoelectric material 304 for purposes of the resonator 302 is less than the thickness of the wafer of piezoelectric material illustrated in FIG. 6B. Therefore, in FIG. 6C, the wafer of piezoelectric material 304 is thinned by lapping/grinding and/or chemical etching, or in any other suitable manner. For example, the wafer of piezoelectric material may have a thickness between approximately 350-550 microns, or any other suitable thickness, prior to thinning, and less than approximately 50 microns (e.g., 10 microns, 20 microns, or 30 microns), or any other suitable thickness, after thinning. The thinned thickness may depend on the type of piezoelectric material structure formed (e.g., resonator, filter, sensor, etc.) and the mode and frequency of operation of the structure. After the thinning is completed, CMP may be performed to produce a smooth surface on the wafer of piezoelectric material 304.

Figure 6C:
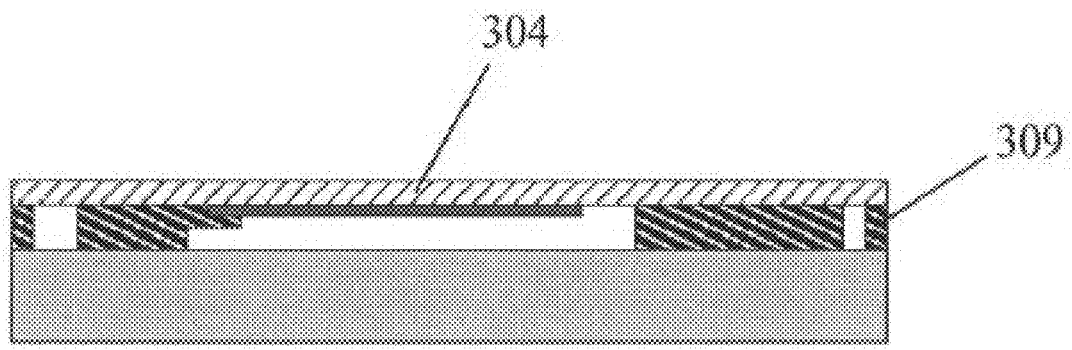

It should be appreciated by reference to FIG. 6C that the bonding layer 309 is formed by the combination of bonding layers 607a and 607b. It should further be appreciated that in some embodiments a single bonding layer may be used, rather than combining multiple bonding layers in the manner shown in FIG. 6B.

Figure 6D:
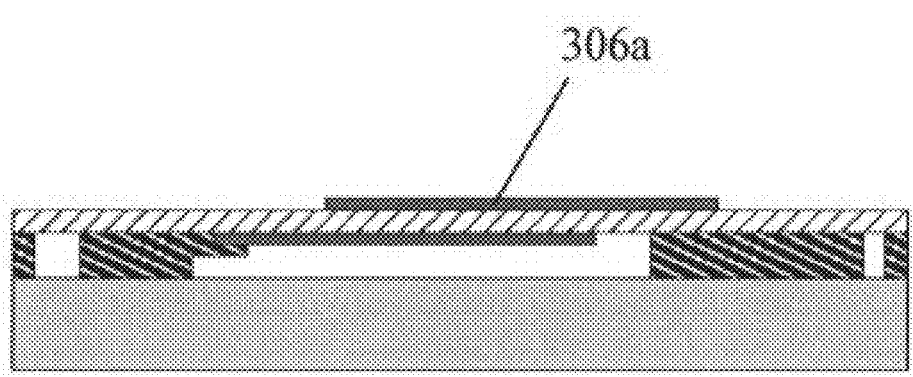

As seen in reference to FIG. 3, the resonator 302 includes a top electrode 306a, which may be formed in FIG. 6D. For example, the top electrode 306a may be formed by depositing and patterning a metal layer.

Figure 6E:
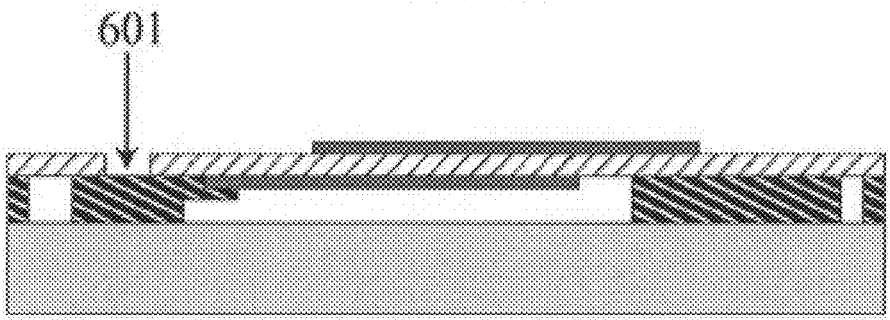
Figure 6F:
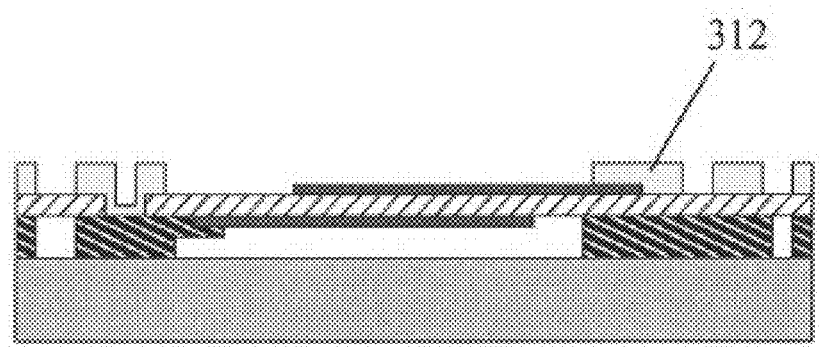

Referring again to FIG. 3, the device 300 provides electrical connection to the bottom electrode 306b by way of the TSV 314. Accordingly, as shown in FIG. 6E, the piezoelectric material 304 may be patterned and etched in any suitable manner to form the opening 601. Then, as shown in FIG. 6F, the metallization layer 312 may be formed. As previously described with respect to FIG. 3, the metallization layer 312 may serve multiple purposes, such as forming a seal ring and/or functioning as a conductive interconnection for the TSVs.

Figure 6G:
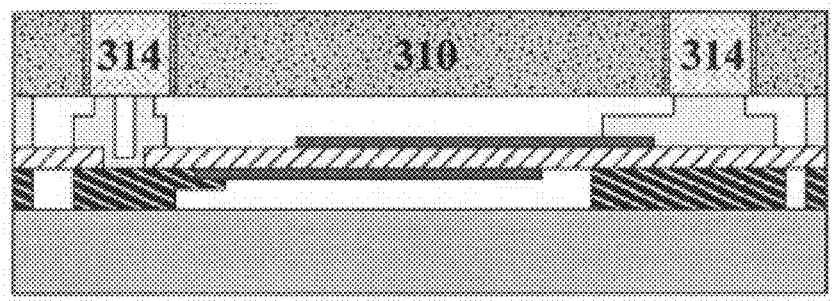

Subsequently, as shown in FIG. 6G, the cap 310, which may have the TSVs 314 already formed therein, may be bonded to the piezoelectric material 304 by the metallization layer 312. According to some embodiments, such bonding may create a high vacuum environment, although not all embodiments are limited in this respect. Also, it should be appreciated that in an alternative embodiment the TSVs 314 may be formed after the cap 310 is bonded to the metallization layer 312.

Figure 6H:
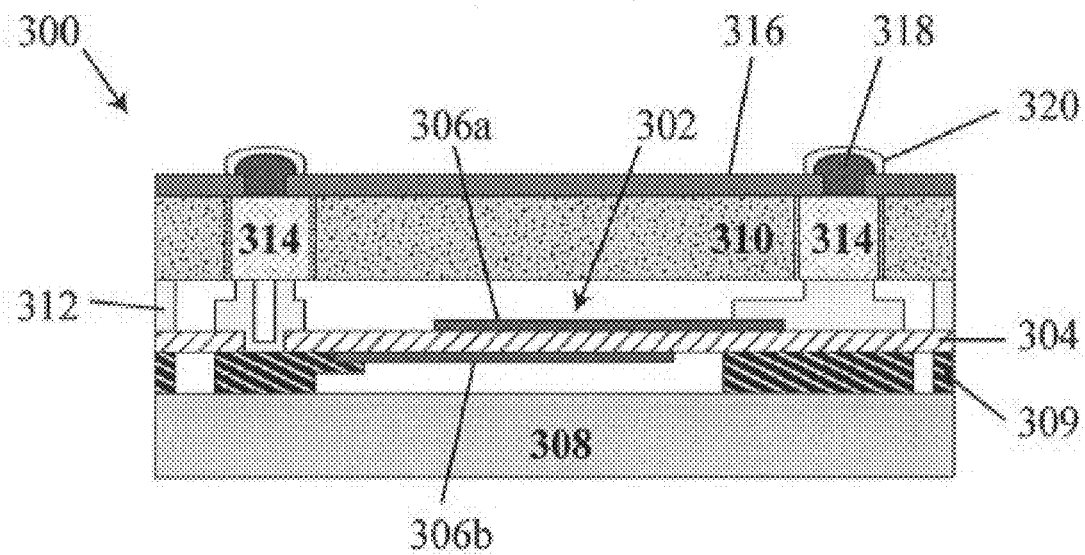

Subsequently, as shown in FIG. 6H, the device 300 may be completed by the formation of additional layers 316 (e.g., by deposition (e.g., CVD or PVD)), 318 (e.g., by electroless plating), and 320 (e.g., by electroless plating), previously described with respect to FIG. 3.

As noted above with respect to FIGS. 1 and 2, the devices described herein can comprise a cap, which can, for example, facilitate the formation of a seal. The seal may be used to encapsulate a device (e.g., a MEMS device, such as a MEMS resonator), which may facilitate operation of the device, prevent contamination of the device, or perform various other beneficial functions. In some embodiments, a device formed on a first substrate or wafer may be capped with a CMOS cap having circuitry (e.g., silicon circuitry) for controlling (e.g., driving and/or sensing) operation of the device. According to one non-limiting embodiment, the first wafer includes a MEMS resonator having a micromechanical resonating structure (e.g., a piezoelectric resonating structure), and the first wafer is capped with a CMOS cap including circuitry suitable for controlling operation of the MEMS resonator.

Figure 7A:
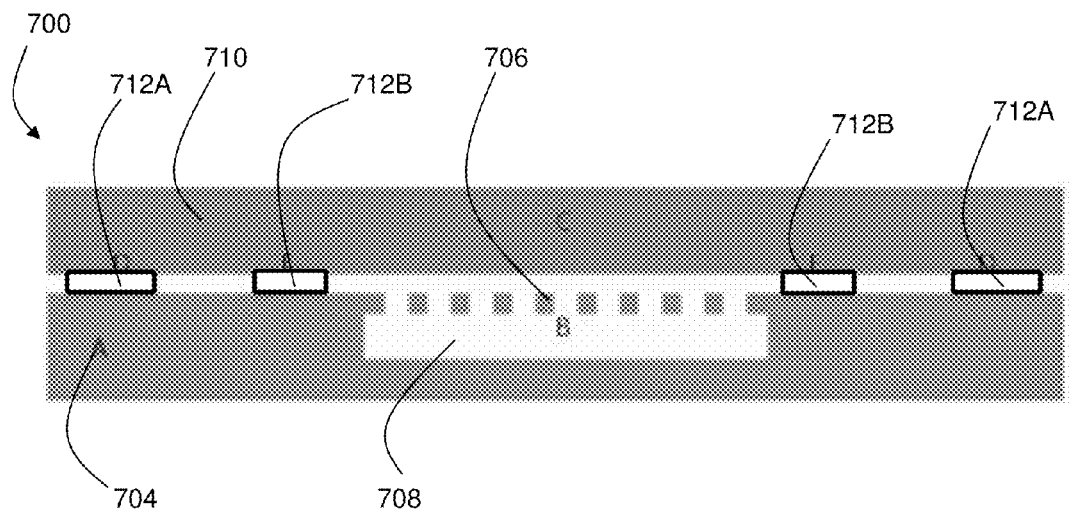
FIGS. 7A-7B illustrate a device having a resonator, a substrate, a cap, and an electrically conductive material, according to one embodiment.
Figure 7B:
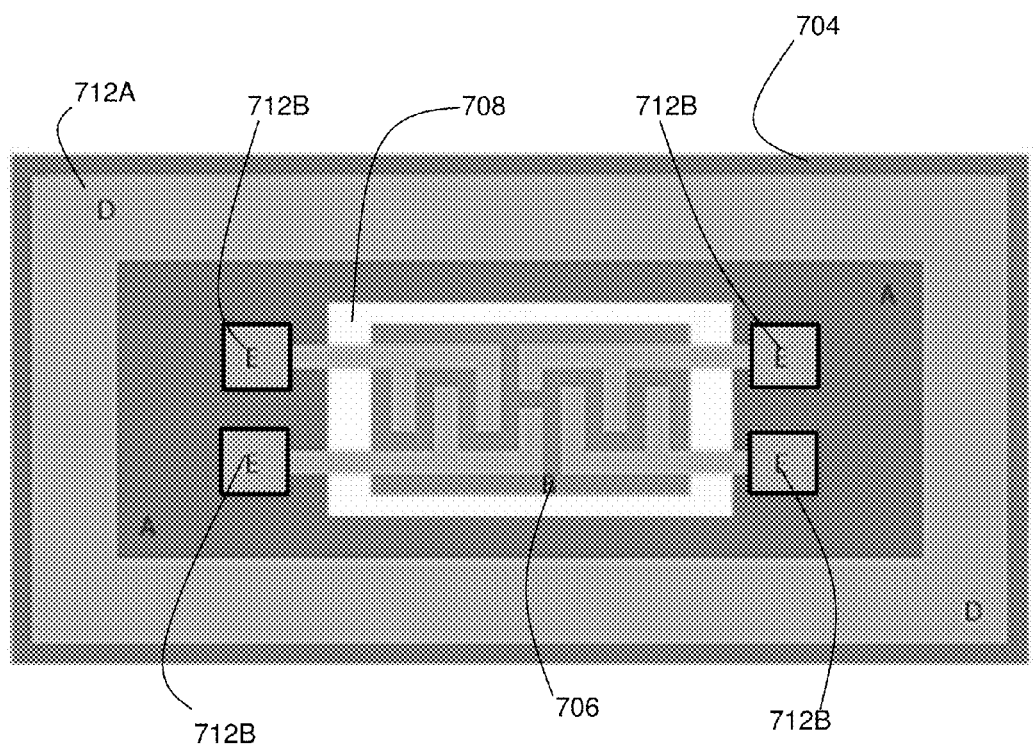

According to at least some of those aspects described herein in which a substrate or wafer including a device (e.g., a device wafer or a device substrate) is capped (e.g., with a CMOS cap including CMOS circuitry), the cap and wafer/substrate may be bonded in any suitable manner, including by use of a bonding material that is electrically and/or thermally conductive (e.g., metallization layer 212 in FIG. 2 and metallization layer 312 in FIG. 3 may be electrically and/or thermally conductive). Suitable bonding with such a material may be used to facilitate the formation of the seal between the substrate and the cap. FIGS. 7A-7B include schematic illustrations of a non-limiting exemplary device 700 in which a seal is formed between substrate 704 and cap 710. FIG. 7A includes a cross-sectional schematic illustration of device 700 while FIG. 7B includes a top-view schematic of device 700.

In FIGS. 7A-7B, the substrate 704 may include a device 706 (e.g., a piezoelectric device), such as a MEMS resonator or any other device of interest. The cap 710 may be a CMOS cap including CMOS circuitry (not shown) suitable for controlling (e.g., driving and/or sensing) operation of the device of substrate 704, though not all embodiments are limited in this respect. In the set of embodiments illustrated in FIGS. 7A-7B, a first portion of electrically conductive material 712A and a second portion of electrically conductive material 712B are positioned between substrate 704 and cap 710. In some embodiments, the electrically conductive material can be modified to produce the seal between the substrate and the cap. For example, a seal between the substrate and the cap can be produced by heating the electrically conductive material (e.g., above the melting point of the electrically conductive material, above the soldering temperature of the electrically conductive material). By sealing the substrate to the cap in this way, a packaged device (e.g., a packaged resonator) can be produced in which the device (e.g., resonator) is housed within a sealed volume. For example, in FIGS. 7A-7B, device 706 is sealed within volume 708 by first portion 712A.

As noted elsewhere herein, a seal can be formed between the substrate and the cap, optionally using the electrically and/or thermally conductive material. In some embodiments, the electrically and/or thermally conductive material can be used to form a hermetic seal between the substrate and cap. In some cases, the electrically and/or thermally conductive material can be used to create a controlled atmosphere around the resonator. For example, the electrically and/or thermally conductive material may be used to seal a gas (e.g., an inert or non-inert gas) within a cavity between the substrate and the cap. The electrically and/or thermally conductive material can also be used to form a vacuum seal between the substrate and cap. For example, in some embodiments, the absolute pressure within a cavity formed by sealing the substrate to the cap (e.g., using the electrically conductive material) can be less than about 0.5 bar, less than about 0.1 bar, less than about 0.01 bar, less than about $10^{-3}$ bar, less than about $10^{-5}$ bar, less than about $10^{-7}$ bar, less than about $10^{-10}$ bar, between about $10^{-12}$ bar and about 0.5 bar, between about $10^{-12}$ bar and about 0.1 bar, between about $10^{-12}$ bar and about 0.01 bar, between about $10^{-12}$ bar and about $10^{-3}$ bar, between about $10^{-12}$ bar and about $10^{-5}$ bar, between about $10^{-12}$ bar and about $10^{-7}$ bar, or between about $10^{-12}$ bar and about $10^{-10}$ bar.

The electrically and/or thermally conductive material can be formed on the substrate, the cap, or both the substrate and cap prior to being modified to produce the seal between the cap and the substrate. In the set of embodiments illustrated in FIG. 7B, material 712A and/or 712B is formed on substrate 704. The electrically conductive material can be formed on the substrate and/or cap using any suitable method. For example, the material 712A and/or 712B can be printed onto a substrate and/or a cap (e.g., in the case of a printed metal or polymer paste). In some embodiments, the material 712A and/or 712B can be sputtered onto a substrate and/or a cap. The material 712A and/or 712B can also be evaporated onto a substrate and/or a cap. In still other embodiments, the material 712A and/or 712B can be deposited via electroplating or electroless plating.

Any suitable dimensions of the material 712A and/or 712B may be chosen to achieve the functionality described herein. For example, in some embodiments the dimensions (e.g., thickness, width, etc.) may be chosen to ensure the material 712A and/or 712B (e.g., continuous material portion 712A) forms a suitable seal between the substrate and the cap. In some embodiments, the dimensions may be chosen to ensure the material 712A and/or 712B provides desired electrical and/or thermal properties. In some embodiments, the material 712A and/or 712B may be relatively thick. The use of thick bonding layers (e.g., thick layers of material 712A and/or 712B) may be advantageous because, in some cases, variations in the thickness of relatively thick bonding layers may have a relatively small effect on the quality of the seal produced by the layer. For example, in some embodiments, a seal can be formed by heating the material portion 712A, during which the material can reflow. When a relatively thick bonding material layer is used, more bonding material (e.g., material portion 712A) is available to fill voids between the substrate and the cap during the reflow process, thereby producing a relatively good seal. In some embodiments, the average thickness of the material 712A and/or 712B can be at least about 0.1 microns, at least about 0.5 microns, at least about 1 micron, at least about 5 microns, at least about 10 microns, at least about 50 microns, between about 0.1 microns and about 100 microns, between about 0.5 microns and 10 microns, between about 1 micron and about 100 microns, between about 5 microns and about 100 microns, between about 10 microns and about 100 microns, or between about 50 microns and 100 microns. Other dimensions are also possible, as the various aspects described herein relating to the use of electrically and/or thermally conductive bonding materials are not limited in this respect.

The material 712A and/or 712B can have a variety of suitable shapes. In some embodiments, the material 712A and/or 712B can circumscribe the device 706 (e.g., a resonator) and/or the cavity within which the device is disposed. The material 712A and/or 712B can form a continuous loop around the device and/or cavity, in some cases. For example, in the set of embodiments illustrated in FIG. 7B, electrically and/or thermally conductive material portion 712A is shown as a continuous loop that circumscribes volume 708 and device 706. The material 712A and/or 712B can be formed on the cap and/or resonator as a continuous loop that circumscribes the resonator and/or cavity prior to modifying (e.g., via heating) the electrically conductive material to form the seal. In other cases, the material 712A and/or 712B can be formed on the cap and/or resonator as a discontinuous loop and, after modifying the material (e.g., via heating and melting a component of the electrically conductive material), a continuous loop circumscribing the device and/or cavity can be formed. By forming the material 712A and/or 712B as a substantially continuous loop circumscribing the device and/or cavity, one can ensure that the resonator cavity is sufficiently sealed. In one embodiment, the material 712A may form a continuous loop while the material 712B may form one or more discrete pillars (alternatively referred to as vias).

The electrically and/or thermally conductive material may comprise a variety of materials. In some embodiments, all or part of the material 712A and/or 712B can be formed of a metal including, but not limited to, gold, silver, copper, tin, and/or an alloy of these. The material 712A and/or 712B can comprise, in some embodiments, a solder such as SnAgCu (i.e., SAC) solder, Au/Sn solder, and/or Ag/Sn solder. In some embodiments, all or part of the material 712A and/or 712B can be formed of an electrically conductive polymer. Examples of such polymers include intrinsically conductive polymers (e.g., polypyrroles (PPY), polycarbazoles, poly(p-phenylebe sulfide) (PPS), poly(acetylene) (PA), poly(p-phenylene vinylebe) (PPV), etc.) and non-conductive polymers that have been combined with an electrically conductive material (e.g., a non-conductive polymer paste mixed with metal particles). In some embodiments, portions 712A and 712B can be formed of the same material, which can simplify fabrication of the packaged device. It should be understood, however, that in other cases, portions 712A and 712B can be formed of different materials.

In those embodiments in which the material 712A and/or 712B is electrically conductive, the composition of the electrically conductive material can be selected to provide a desired level of electrical conductivity. In some embodiments, the electrically conductive material can have an electrical resistivity of less than about 1000 $\Omega$cm, less than about 10 $\Omega$cm, less than about 1 $\Omega$cm, less than about 0.01 $\Omega$cm, less than about $1\times10^{-3}$ $\Omega$cm, less than about $1\times10^{-4}$ $\Omega$cm, less than about $1\times10^{-5}$ $\Omega$cm, less than about $1\times10^{-6}$ $\Omega$cm, less than about $1\times10^{-8}$ $\Omega$cm, between about $1\times10^{-10}$ $\Omega$cm and about 1000 $\Omega$cm, between about $1\times10^{-10}$ $\Omega$cm and about 10 $\Omega$cm, between about $1\times10^{-10}$ $\Omega$cm and about 1 $\Omega$cm, between about $1\times10^{-10}$ $\Omega$cm and about 0.01 $\Omega$cm, between about $1\times10^{-10}$ $\Omega$cm and about $1\times10^{-3}$ $\Omega$cm between about $1\times10^{-10}$ $\Omega$cm and about $1\times10^{-4}$ $\Omega$cm, between about $1\times10^{10}$ $\Omega$cm and about $1\times10^{-5}$ $\Omega$cm or between about $1\times10^{-10}$ $\Omega$cm and about $1\times10^{-6}$ $\Omega$cm.

In those embodiments in which the material 712A and/or 712B is thermally conductive, the composition of the material may be selected to provide a desired level of thermal conductivity. The use of electrically conductive materials that are also thermally conductive can assist in transporting heat away from the resonator or other device (e.g., in cases where relatively high power electronics are employed), which can enhance the performance of the resonator or other device. In some embodiments, the electrically conductive material can be selected to have a thermal conductivity of at least about 5 W/mK, at least about 10 W/mK, at least about 50 W/mK, at least about 100 W/mK, at least about 1000 W/mK, between about 5 W/mK and about 5000 W/mK, between about 10 W/mK and about 5000 W/mK, between about 50 W/mK and about 5000 W/mK, between about 100 W/mK and about 5000 W/mK, or between about 1000 W/mK and about 5000 W/mK.

In some embodiments in which a substrate is capped, the packaged device (e.g., packaged micromechanical resonator) is constructed and arranged such that an electrical signal may be transmitted between the device on the substrate (e.g., the micromechanical resonator within the sealed volume) and integrated circuitry outside the sealed volume (e.g., on the cap) through the electrically conductive material (e.g., material portion 712A and/or one or more of portions 712B). For example, in some embodiments, a supply voltage can be transmitted through the electrically conductive material between the substrate and integrated circuitry on the cap. The electrically conductive material may be part of an electrically conductive pathway used to actuate the device (e.g., to actuator a resonator on the substrate), detect vibration of the device (e.g., resonator), and/or otherwise control the device. In some cases, the electrically conductive material is used as part of a ground electrical connection and transmits a ground signal between the substrate and the cap.

As noted above, a signal can be transmitted through electrically conductive material portion 712A and/or one or more of electrically conductive material portions 712B. In some embodiments, electrically conductive material portion 712A can provide a seal between the substrate 704 and the cap 710 and transmit any of the signals described herein (in the presence or absence of electrically conductive material portions 712B). In other embodiments, electrically conductive material portion 712A can be used solely to provide a seal between the substrate 704 and the cap 710, without transmitting any signals, and electrically conductive material portions 712B can be used to transmit any of the signals described herein.

Although the continuous loop of material 712A in FIG. 7B is shown as being disconnected from material portions 712B and the resonator electrode material, it should be understood that, in other embodiments, the continuous loop of material 712A can be in physical contact with one or more electrodes of the resonator and/or one or more of material portions 712B. In some embodiments, material portion 712A might only be in contact with substrate 714 and cap 710, and constructed and arranged such that no signals are transmitted through portion 712A. In still other cases, material portion 712A might be connected to one or more electrodes of the resonator and/or one or more material portions 712B at a different device level (e.g., through one or more vias).

Figure 8:
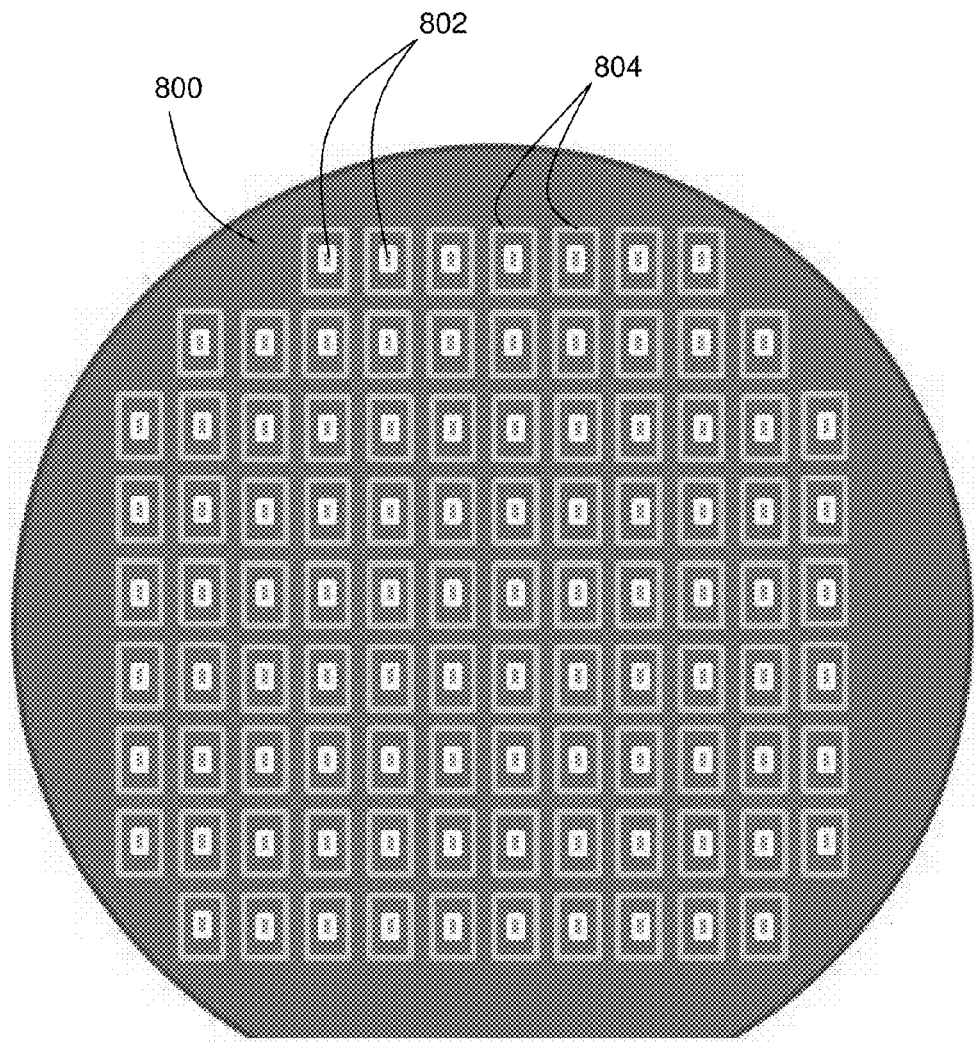
FIG. 8 illustrates a substrate including a plurality of resonators circumscribed by sections of electrically conductive material, according to one embodiment.

While FIGS. 7A-7B illustrate the deposition of the bonding material (e.g., on the substrate and/or cap) and sealing of the substrate to the cap for a single device, it should be understood that deposition of the bonding material and/or sealing of the substrate to the cap can also be performed for several devices simultaneously (e.g., at the wafer level in a traditional microfabrication process). FIG. 8 includes a schematic diagram of a wafer substrate 800 comprising a plurality of devices 802 (e.g., resonators), as a non-limiting example of a device of interest. Each of the resonators may be a piezoelectric resonator including a micromechanical resonating structure and may be surrounded by an electrically conductive material 804, which can be used as a bonding material to form a seal between wafer substrate 800 and a wafer cap (not shown).

According to one aspect of the technology described herein, a substrate/wafer including a device may be capped by a "generic" CMOS cap. The CMOS cap may be "generic" in the sense that, according to some embodiments, it need not be physically arranged to facilitate operation of the device on the substrate/wafer. For example, the substrate/wafer may include a device whose operation is not impacted, or not significantly impacted, by the particular physical surroundings/environment. As a non-limiting example, the device 706 may be a MEMS resonator whose operation is not significantly impacted by the characteristics of the volume 708 in which it is disposed, including the size of the cavity, the pressure, etc. In such instances, a generic cap 710 may be used which need not be physically arranged to provide any particular characteristics of the volume 708. Rather, the cap 710 may take any physical configuration suitable for mating to the substrate 704, and may include any suitable circuitry for interacting with the device 706.

One advantage of those aspects described herein in which a "generic" CMOS cap may be used to form a sealed device is that the design of the cap may be decoupled from the design of the substrate and resonator such that a variety of cap designs can be employed without affecting the performance of the resonator. That is to say, in some embodiments described herein, the performance of resonator is not dependent upon the form factor, material of construction, or any other property of the cap. As a result, a variety of caps with different "generic" configurations can be interchanged in the manufacturing process without affecting the performance of the resonator. For example, a first set of packaged resonators may be produced by sealing a cap comprising a substantially flat semiconductor wafer (or portion of a semiconductor wafer) to a substrate, and a second set of packaged resonators may be produced by sealing a cap including a cavity on the sealing surface to a substrate. In addition, caps provided by outside vendors can be integrated into the manufacturing process without the need to adjust the design of the substrate, resonator, and/or assembly equipment in view of the cap design.

It should be appreciated that various alterations and modifications to the examples described above are possible. For example, while some of the embodiments have been described as including piezoelectric resonators, it should be appreciated that such structures are not limiting. Some of the techniques described herein may be used to form piezoelectric filters, piezoelectric sensors, or other devices, and resonators should be understood to be merely one non-limiting example.

Having thus described several aspects of at least one embodiment of the technology, it is to be appreciated that various alterations, modifications, and improvements will readily occur to those skilled in the art. Such alterations, modifications, and improvements are intended to be within the spirit and scope of the invention. Accordingly, the foregoing description and drawings provide non-limiting examples only.

For example, the devices 200 and 300 have been shown as including caps 210 and 310. Alternatively, thin film layers may be formed by deposition to create a seal (e.g., a hermetic seal), without bonding of a cap wafer. Other configurations are also possible.

What is claimed is:

1. A packaged micromechanical resonator, comprising:
   a substrate;
   a cap comprising integrated circuitry;
   a first portion of an electrically conductive material between the substrate and the cap, disposed such that the substrate, the cap, and the first portion of the electrically conductive material define a sealed, enclosed volume;
   a micromechanical resonator comprising a piezoelectric material disposed within the enclosed volume; and
   a second portion of the electrically conductive material between the substrate and the cap constructed and arranged such that a signal can be transmitted between the micromechanical resonator and the integrated circuitry through the second portion of the electrically conductive material.

2. A packaged micromechanical resonator, comprising:
a substrate;
a cap comprising integrated circuitry;
a first portion of an electrically conductive material between the substrate and the cap, disposed such that the substrate, the cap, and the first portion of the electrically conductive material define a sealed, enclosed volume;
a micromechanical resonator disposed within the enclosed volume; and
a second portion of the electrically conductive material between the substrate and the cap constructed and arranged such that a signal can be transmitted between the micromechanical resonator and the integrated circuitry through the second portion of the electrically conductive material;
wherein the first and/or second portions of the electrically conductive material have an average thickness of at least about 5 microns.

3. A packaged micromechanical resonator, comprising:
a substrate;
a cap comprising integrated circuitry;
a first portion of an electrically conductive material between the substrate and the cap, disposed such that the substrate, the cap, and the first portion of the electrically conductive material define a sealed, enclosed volume;
a micromechanical resonator configured to oscillate in plane disposed within the enclosed volume; and
a second portion of the electrically conductive material between the substrate and the cap constructed and arranged such that a signal can be transmitted between the micromechanical resonator and the integrated circuitry through the second portion of the electrically conductive material.

4. A method of packaging a micromechanical resonator, comprising:
providing a substrate on which a micromechanical resonator is disposed;
providing a cap comprising integrated circuitry;
positioning first and second portions of an electrically conductive material between the substrate and the cap; and
modifying the first and second portions of the electrically conductive material such that the first portion of the electrically conductive material produces a seal between the substrate and the cap and such that a signal can be transmitted between the micromechanical resonator and the integrated circuitry through the second portion of the electrically conductive material.

5. A resonator as in claim 1, wherein the resonator comprises a microelectromechanical systems (MEMS) resonator.

6. A resonator as in claim 1, wherein the resonator is configured to support Lamb waves.

7. A resonator as in claim 1, wherein the resonator comprises a piezoelectric material.

8. A resonator as in claim 1, wherein the resonator comprises a piezoelectric material chosen from the group consisting of: aluminum nitride (AlN), zinc oxide (ZnO), cadmium sulfide (CdS), lead titanate ($PbTiO_3$), lead zirconate titanate (PZT), lithium niobate ($LiNbO_3$), lithium tantalate ($LiTaO_3$), potassium niobate ($KNbO_3$), $Li_2B_4O_7$, langasite ($La_3Ga_5SiO_{14}$), gallium arsenside (GaAs), barium sodium niobate, bismuth germanium oxide, indium arsenide, and indium antimonide.

9. A resonator as in claim 1, wherein the resonator is suspended above the substrate.

10. A resonator as in claim 1, wherein the substrate has a cavity formed therein, and wherein the resonator is suspended above the cavity.

11. A resonator as in claim 1, wherein the first and/or second portions of electrically conductive material comprise an electrically conductive polymer and/or a metal.

12. A resonator as in claim 1, wherein the first and/or second portions of electrically conductive material comprise gold, silver, copper, and/or tin.

13. A resonator as in claim 1, wherein the integrated circuitry is constructed and arranged to control the resonator.

14. A resonator as in claim 1, wherein the integrated circuitry is constructed and arranged to actuate the resonator and/or detect vibration of the resonator.

15. A resonator as in claim 1, wherein the first portion of the electrically conductive material circumscribes the resonator.

16. A resonator as in claim 1, wherein the first and/or second portions of the electrically conductive material have a resistivity of less than about 1000 Ωm.

17. A resonator as in claim 1, wherein the packaged resonator comprises a hermetic seal.

18. A method as in claim 4, wherein modifying the first and/or second portions of the electrically conductive material comprises heating the first and/or second portions of the electrically conductive material.

19. A resonator as in claim 1, wherein the first and/or second portions of the electrically conductive material has a thermal conductivity of at least about 5 W/mK.

20. A resonator as in claim 1, wherein the second portion of the electrically conductive material is used as part of a ground electrical connection.

21. A resonator as in claim 1, wherein the first and/or second portions of the electrically conductive material are printed, sputtered, or evaporated onto the substrate and/or cap.

22. A resonator as in claim 1, wherein the substrate and/or cap comprises at least a portion of a semiconductor wafer.

23. A resonator as in claim 1, wherein the first and/or second portions of the electrically conductive material have an average thickness of between about 0.1 microns and about 100 microns.

24. A resonator as in claim 1, wherein the first and second portions of the electrically conductive material are the same portion of the electrically conductive material.

25. A resonator as in claim 1, wherein the first and second portions of the electrically conductive material are different portions of the electrically conductive material.

26. A resonator as in claim 1, wherein the first and second portions of the electrically conductive material have the same chemical composition.

27. A resonator as in claim 1, wherein the first and second portions of the electrically conductive material have different chemical compositions.

28. The resonator of claim 1, wherein the first portion of the electrically conductive material forms a seal between the substrate and the cap.

29. The resonator of claim 28, wherein the seal is a hermetic seal.

30. The resonator of claim 29, wherein the seal makes a vacuum seal.

31. The resonator of claim 29, wherein the seal makes a no-vacuum seal.

32. The resonator of claim 28, wherein the seal is a non-hermetic seal.

* * * * *

UNITED STATES PATENT AND TRADEMARK OFFICE
CERTIFICATE OF CORRECTION

PATENT NO. : 8,466,606 B2
APPLICATION NO. : 12/899447
DATED : June 18, 2013
INVENTOR(S) : David M. Chen et al.

It is certified that error appears in the above-identified patent and that said Letters Patent is hereby corrected as shown below:

In the Claims

At column 20, line 67, claim 31, delete "no-vacuum" and replace it with --non-vacuum--.

Signed and Sealed this
Twenty-fourth Day of September, 2013

Teresa Stanek Rea
*Deputy Director of the United States Patent and Trademark Office*